United States Patent
Park et al.

(10) Patent No.: US 8,890,067 B2
(45) Date of Patent: Nov. 18, 2014

(54) INSPECTION SYSTEM USING SCANNING ELECTRON MICROSCOPE

(71) Applicant: Samsung Display Co., Ltd., Yongin, Gyeonggi-Do (KR)

(72) Inventors: Young-Gil Park, Yongin (KR); Won-Bong Baek, Yongin (KR); Ki-Won Oh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/905,623

(22) Filed: May 30, 2013

(65) Prior Publication Data
US 2013/0320211 A1 Dec. 5, 2013

(30) Foreign Application Priority Data
May 30, 2012 (KR) .................. 10-2012-0057468

(51) Int. Cl.
*H01J 37/26* (2006.01)
*H01J 37/18* (2006.01)
*H01J 37/28* (2006.01)
*H01J 37/20* (2006.01)

(52) U.S. Cl.
CPC ......... *H01J 37/26* (2013.01); *H01J 2237/2605* (2013.01); *H01J 37/185* (2013.01); *H01J 37/28* (2013.01); *H01J 37/20* (2013.01); *H01J 2237/24592* (2013.01)
USPC ........... 250/310; 250/306; 250/307; 250/311; 250/440.11; 250/442.11

(58) Field of Classification Search
USPC ........ 250/306, 307, 310, 311, 440.11, 442.11
See application file for complete search history.

(56) References Cited

U.S. PATENT DOCUMENTS

| | | | | |
|---|---|---|---|---|
| 4,460,827 A | * | 7/1984 | Onoguchi et al. | 250/310 |
| 4,864,228 A | * | 9/1989 | Richardson | 324/754.22 |
| 5,093,577 A | * | 3/1992 | de Poorter et al. | 250/397 |
| 5,270,643 A | * | 12/1993 | Richardson et al. | 324/754.22 |
| 5,572,327 A | * | 11/1996 | Plinke et al. | 356/438 |
| 6,545,272 B1 | * | 4/2003 | Kondo | 250/305 |
| 6,683,316 B2 | * | 1/2004 | Schamber et al. | 250/492.1 |
| 6,812,462 B1 | * | 11/2004 | Toth et al. | 850/1 |
| 6,953,939 B2 | * | 10/2005 | Abe et al. | 250/441.11 |
| 6,972,422 B2 | * | 12/2005 | Lee et al. | 250/559.41 |
| 7,230,253 B2 | * | 6/2007 | Ham | 250/442.11 |

(Continued)

FOREIGN PATENT DOCUMENTS

| | | |
|---|---|---|
| JP | 09-134699 | 5/1997 |
| JP | 2007-003352 | 1/2007 |

(Continued)

*Primary Examiner* — Michael Logie
(74) *Attorney, Agent, or Firm* — Robert E. Bushnell, Esq.

(57) ABSTRACT

An inspection system using a scanning electron microscope includes a scanning electron microscope chamber inspecting an object to be inspected by using an electron beam and maintaining a vacuum condition, a stage positioned below the scanning electron microscope chamber to be separated therefrom and mounted with the object to be inspected, and a transverse guide transferring the scanning electron microscope chamber on the stage. Atmospheric conditions are maintained between the scanning electron microscope chamber and the object to be inspected. Accordingly, object to be inspected a large size of an object to be inspected may be inspected without damage to the object to be inspected such that a cost reduction and a yield improvement may be realized.

15 Claims, 8 Drawing Sheets

(56) References Cited

U.S. PATENT DOCUMENTS

| | | | |
|---|---|---|---|
| 7,339,167 B2* | 3/2008 | Ohshima et al. | 250/310 |
| 7,456,413 B2* | 11/2008 | Buijsse et al. | 250/441.11 |
| 8,164,057 B2* | 4/2012 | Shachal | 250/307 |
| RE44,035 E* | 3/2013 | Schamber et al. | 250/492.1 |
| 8,658,974 B2* | 2/2014 | Buijsse | 250/311 |
| 2002/0083607 A1* | 7/2002 | Atsuhiko et al. | 33/553 |
| 2007/0145267 A1* | 6/2007 | Adler et al. | 250/310 |
| 2010/0140470 A1* | 6/2010 | Shachal | 250/307 |
| 2011/0210247 A1* | 9/2011 | Shachal et al. | 250/307 |
| 2011/0311996 A1* | 12/2011 | Friedberger et al. | 435/7.92 |

FOREIGN PATENT DOCUMENTS

| | | |
|---|---|---|
| KR | 1020040070733 A | 8/2004 |
| KR | 1020040076734 A | 9/2004 |
| KR | 10-2011-0076934 A | 7/2011 |

* cited by examiner

INSPECTION SYSTEM USING SCANNING ELECTRON MICROSCOPE

CLAIM OF PRIORITY

This application makes reference to, incorporates the same herein, and claims all benefits accruing under 35 U.S.C. §119 from an application earlier filed in the Korean Intellectual Property Office on May 30, 2012 and there duly assigned Serial No. 10-2012-0057468.

BACKGROUND OF THE INVENTION

1. Field of the Invention

The present invention relates generally to an inspection system that uses a scanning electron microscope, and more particularly, to an inspection system that uses a scanning electron microscope to perform inspections of an object under atmospheric conditions without limitation of the size of the object.

2. Description of the Related Art

In general, flat panel display devices such as liquid crystal display (LCD) devices and organic light emitting diode (OLED) display devices are formed by depositing a plurality of thin films and wires on a substrate. In order to inspect for the existence of imperfections such as impurities or particles on a thin film of a flat panel display device or for short circuits between the wires, an inspection system constructed with a scanning electron microscope (SEM) is used.

A vacuum scanning electron microscope may be used in the inspection system. The size of a specimen to be observed by a contemporary SEM is limited by the size of a vacuum chamber of the SEM. A vacuum scanning electron microscope that is capable of observing a semiconductor wafer fabricated up to 30 inches in width has been developed; however, usage of the such a vacuum scanning electron microscope is difficult for purposes such as conducting an inspection of the flat panel display devices of the size from 730 mm×920 mm to 2200 mm×2500 mm due to the size limitations on the vacuum chamber of the SEM.

When the size of the vacuum chamber is increased so as to be able to receive a flat panel display device, by a workpiece such as a secondary electron (SE) or a back-scattering electron (B SE) generated an object to be inspected that is to be inspected and that has been positioned in the vacuum chamber is deleteriously affected by interference caused by a charging effect generated in the vacuum chamber so that observation of an image of the object to be inspected becomes difficult, and carbon contamination by a hydrocarbon compound (HxCx) may be generated by a pump used for the vacuum chamber.

The foregoing discussion of this information disclosed in this Background section is only for enhancement of an understanding of the background of the described technology and therefore it may contain information that does not form the prior art that is already known in this country to a person of ordinary skill in the art.

SUMMARY OF THE INVENTION

Accordingly, it is an object to provide an improved inspection system. An embodiment of the present invention provides an inspection system using a scanning electron microscope for performing an inspection of an object to be inspected under atmospheric conditions without limitation upon the size of the object to be inspected.

According to one embodiment of the present invention, an inspection system may include a scanning electron microscope chamber able to make an inspection of an object by using an electron beam and maintain a vacuum condition within the chamber, a stage positioned below the scanning electron microscope chamber to be separated therefrom and mounted with the object to be inspected; and a transverse guide for transferring the scanning electron microscope chamber on the stage. Atmospheric conditions are maintained between the scanning electron microscope chamber and the object to be inspected.

An optical microscope may be attached to the scanning electron microscope chamber and irradiate light toward the object to be inspected in order to inspect the object to be inspected.

A first optical inspection of the object to be inspected may be performed through the optical microscope, and a second detailed inspection of the object to be inspected may be performed through the scanning electron microscope chamber.

The scanning electron microscope chamber may include a vacuum chamber; a scanning electron microscope positioned inside the vacuum chamber to scan the electron beam to the object to be inspected. A signal detector is positioned inside the vacuum chamber to detect a detection signal generated in the object to be inspected.

The signal detector may include a secondary electron detector detecting secondary electrons generated in the object to be inspected; a back-scattering electron detector detecting back-scattering electrons generated in the object to be inspected; and a characteristic X-ray detector detecting a characteristic X-ray generated in the object to be inspected.

A membrane installed below the scanning electron microscope chamber may be further included, and the membrane may permit passage of the electron beam scanned in the scanning electron microscope such that the secondary electrons, the back-scattering electrons, and the characteristic X-ray generated in the object to be inspected may be transferred inside the scanning electron microscope chamber.

A flatness device may be connected to the stage in order to control the flatness of the stage.

An interval control device may be connected to the scanning electron microscope chamber and control a distance between the scanning electron microscope chamber and the object to be inspected.

A membrane particle inspection and removing device may inspect particles attached to the membrane and remove those particles found during the inspection from the membrane.

The membrane particle inspection and removing device may perform the particle inspection and the particle removal of the membrane before the inspection of the object to be inspected using the scanning electron microscope chamber.

A supporting plate supporting the stage and the transverse guide may be further included, and the membrane particle inspection and removing device may be installed on the supporting plate.

A vibration control device may be installed below the supporting plate and measure and eliminate an external vibration to prevent, or at least ameliorate any influence caused by the external vibration on the scanning electron microscope chamber.

A cover frame may enclose the scanning electron microscope chamber, the stage, and the transverse guide and remove magnetism and noise to prevent the magnetism and the noise from affecting the scanning electron microscope chamber.

The object to be inspected may be a flat panel display device.

A thickness of the membrane may be in a range of 10 nm to 3 μm, and the membrane may be made of a non-electrically conductive material.

According to the present invention, by using the inspection system including the scanning electron microscope chamber and the optical microscope connected thereto, the optical image of the particle of the object to be inspected, 3-D information, and component analysis may be simultaneously performed.

Also, the scanning electron microscope chamber and the optical microscope connected thereto are installed on the transverse guide such that the scanning electron microscope chamber and the optical microscope may be moved to a predetermined position relative to the object to be inspected. In this case, the size of the object to be inspected is not a limit upon the capacity or upon the performance of the inspection system.

Also, a contemporary vacuum scanning electron microscope is limited to the size of the vacuum chamber such that inspection of an object to be inspected of a larger size such as a flat panel display device is difficult. According to the present invention, however, the atmospheric conditions are maintained between the scanning electron microscope chamber and the object to be inspected object such that the inspection of the object to be inspected of a larger size is possible under the atmospheric conditions, and thereby the shape, the component, the structure, etc., of the object to be inspected of a larger size may be observed and analyzed.

According to the present invention, the object to be inspected of a larger size may be inspected for the analysis without damage to the object to be inspected such that a cost reduction and a yield improvement may be realized.

Also, the object to be inspected is positioned in the atmospheric conditions such that the image distortion of the object to be inspected by the charging effect generated in the vacuum chamber is prevented and the object to be inspected is not contaminated by carbon, thereby realizing the correct inspection.

As described, according to the characteristic of the scanning electron microscope that is sensitive to external noise such as external vibration, magnetism, and noise, the flatness device and the variation control device are installed to the inspection system in the atmospheric conditions to inspect the object to be inspected such that the influence of the external noise on the inspection system may be minimized

DETAILED DESCRIPTION OF THE INVENTION

Figure 1:
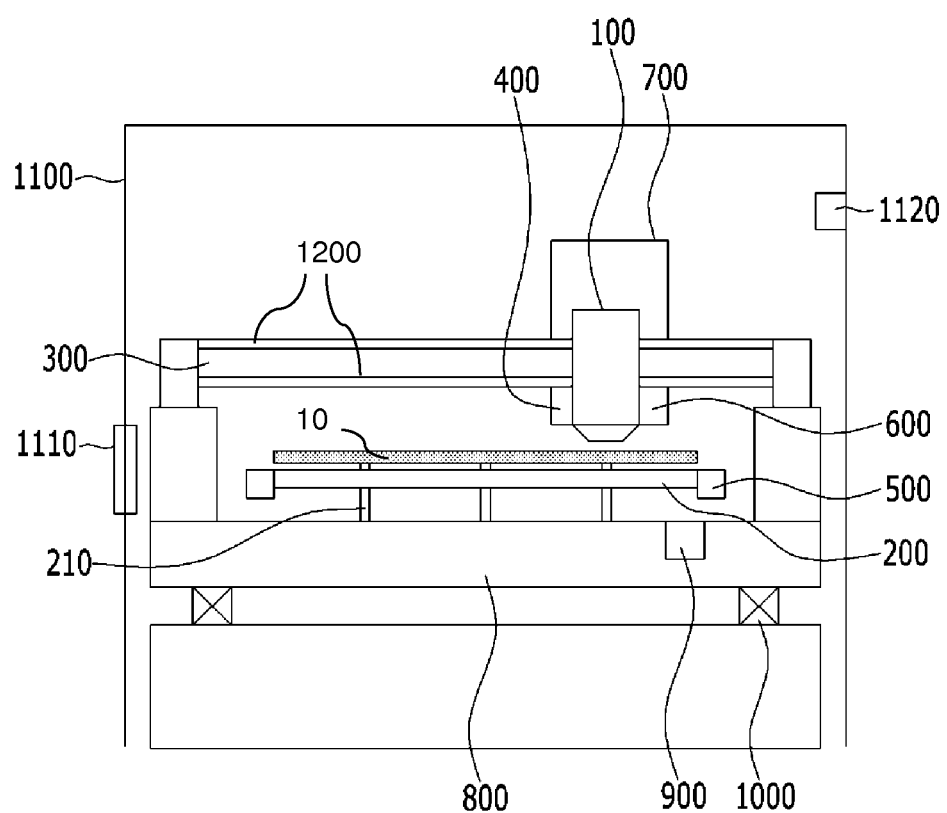
FIG. 1 is a schematic diagram of an inspection system using a scanning electron microscope according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Thus, an inspection system using a scanning electron microscope according to an exemplary embodiment will be described with reference to FIG. 1 to FIG. 5.

Figure 2:
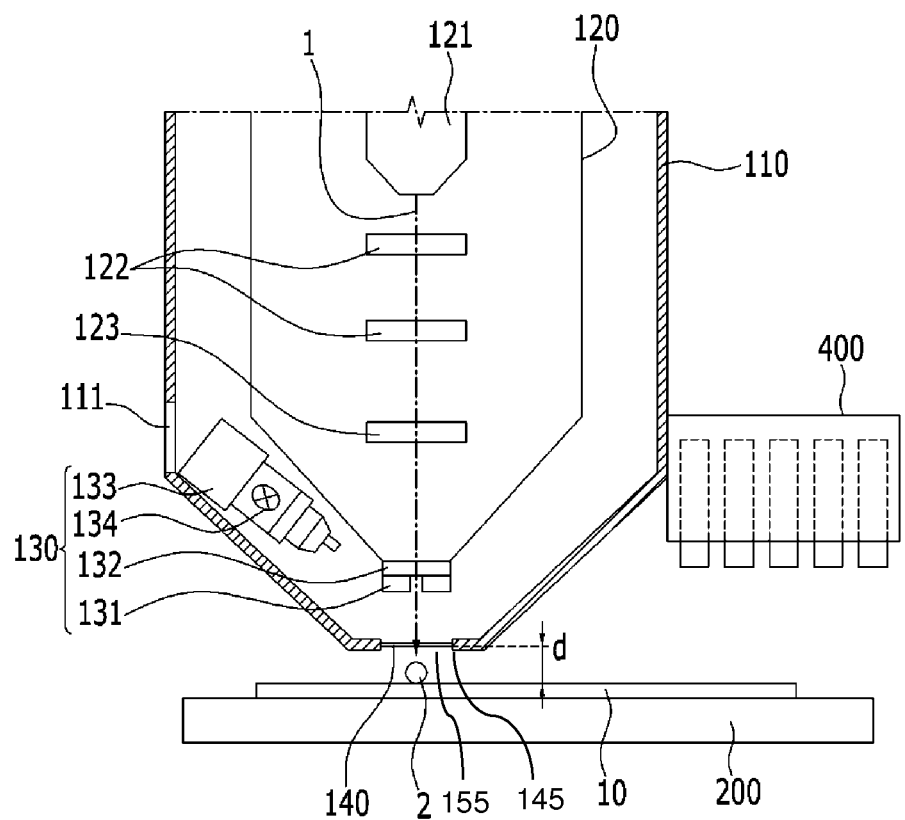
FIG. 2 is an enlarged view of a scanning electron microscope chamber and a stage of an inspection system using a scanning electron microscope according to an exemplary embodiment.
Figure 3:
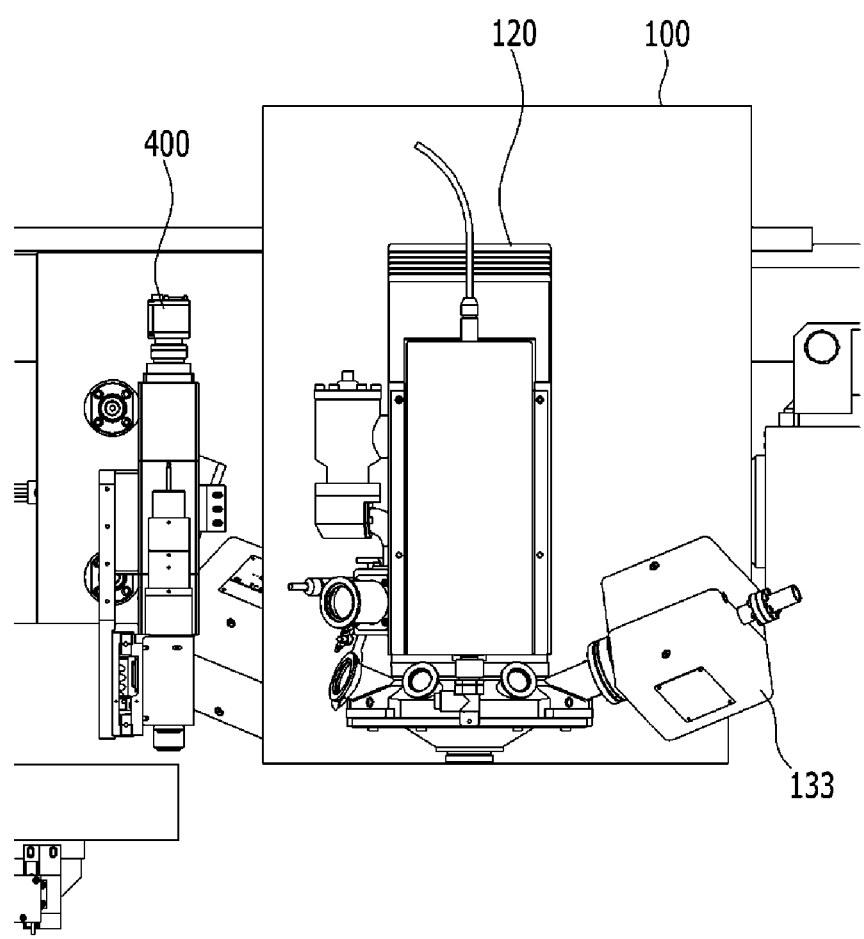
FIG. 3 is a detailed view of a scanning electron microscope chamber of an inspection system using a scanning electron microscope according to an exemplary embodiment.
Figure 4:
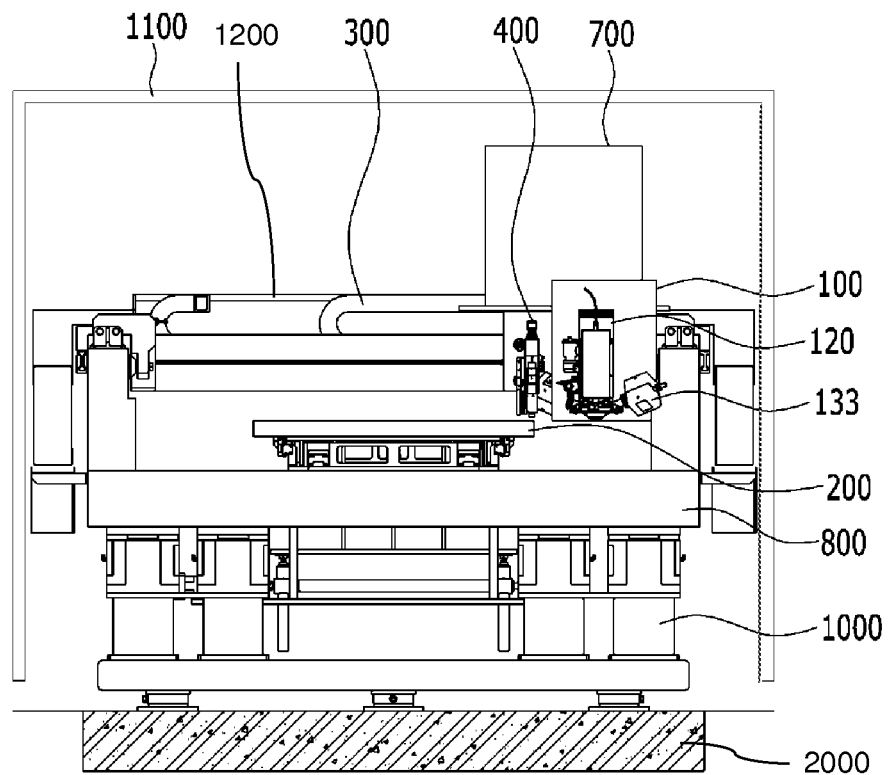
FIG. 4 is a front view of an inspection system using a scanning electron microscope according to an exemplary embodiment.
Figure 5:
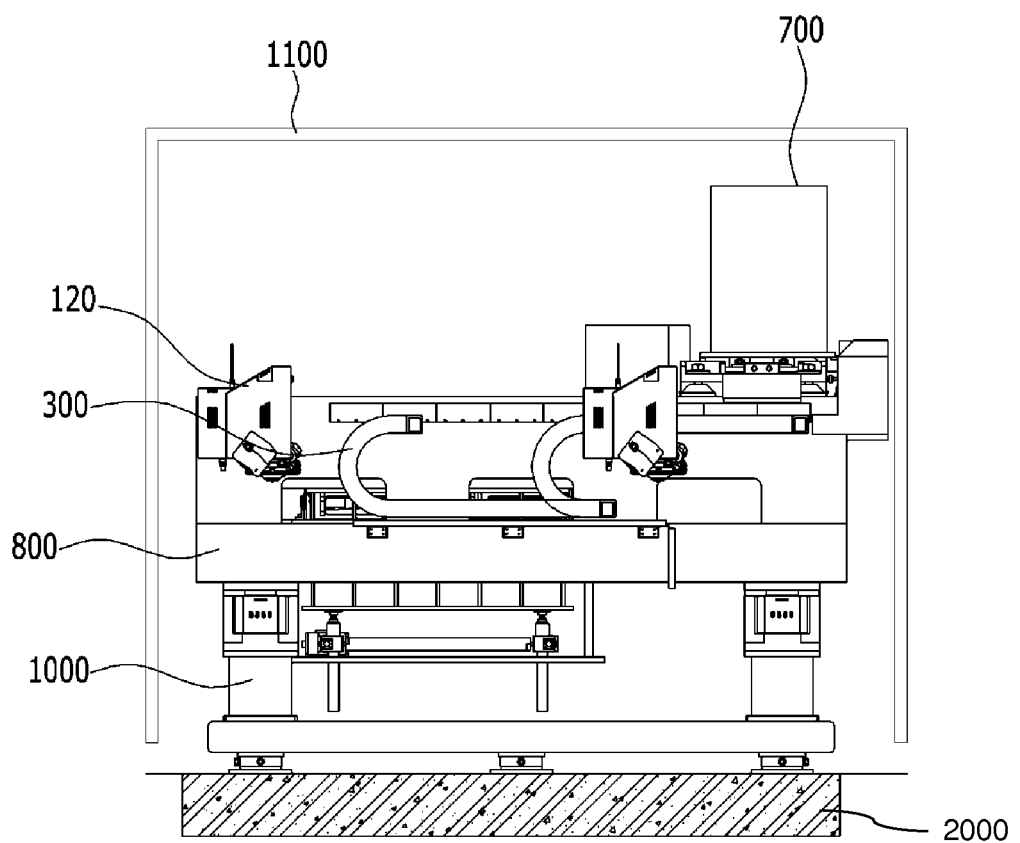
FIG. 5 is a rear view of an inspection system using a scanning electron microscope according to an exemplary embodiment.

FIG. 1 is a schematic diagram of an inspection system using a scanning electron microscope according to an exemplary embodiment, FIG. 2 is an enlarged view of a scanning electron microscope chamber and a stage of an inspection system using a scanning electron microscope according to an exemplary embodiment, FIG. 3 is a detailed view of a scanning electron microscope chamber of an inspection system using a scanning electron microscope according to an exemplary embodiment, FIG. 4 is a front view of an inspection system using a scanning electron microscope according to an exemplary embodiment, and FIG. 5 is a rear view of an inspection system using a scanning electron microscope according to an exemplary embodiment.

As shown in FIG. 1 to FIG. 5, an inspection system using a scanning electron microscope according to an exemplary embodiment includes a scanning electron microscope chamber 100 scanning and irradiating an electron beam 1 onto an object to be inspected 10 to inspect the object to be inspected 10, a stage 200 separated from and disposed below the scanning electron microscope chamber 100 and mounting the object to be inspected 10, and a transverse guide 300 for transferring the scanning electron microscope chamber 100 on the stage 200. The object to be inspected 10 may be a flat panel display device such as a liquid crystal display (LCD) device and an organic light emitting diode (OLED) display device.

As shown in FIG. 2, the scanning electron microscope chamber 100 includes a vacuum chamber 110 maintaining a vacuum condition, a scanning electron microscope 120 positioned inside the vacuum chamber 110 and scanning and irradiating the electron beam 1 onto the object to be inspected 10, and a signal detector 130 positioned inside the vacuum chamber 110 and detecting a signal generated in the object to be inspected 10. As described, the scanning electron microscope 120 and the signal detector 130 are maintained under the vacuum condition inside the scanning electron microscope chamber 100.

The scanning electron microscope 120 includes an electron gun 121 emitting the electron beam 1, an electromagnetic lens 122 such as a condenser lens and an objective lens controlling a propagating direction of the electron beam 1, and an aperture 123 controlling an amount of the propagating electron beam 1.

The signal detector 130 includes a secondary electron detector 131 detecting secondary electrons (SE) generated in the object to be inspected 10 by the electron beam 1 scanned and irradiated onto the object to be inspected 10, a back-scattering electron detector 132 detecting back-scattering electrons (BSE) generated in the object to be inspected 10, and a characteristic X-ray detector 133 detecting a characteristic X-ray generated in the object to be inspected 10. The image of the object to be inspected 10 and components thereof may be measured and analyzed by using the signal detector 130.

The secondary electron detector 131 and the back-scattering electron detector 132 are attached below the scanning electron microscope 120, and the characteristic X-ray detector 133 is obliquely installed to the side surface of the scanning electron microscope 120. The characteristic X-ray detector 133 detects the object to be inspected 10 positioned in the atmospheric condition and the characteristic X-ray generated by the reaction of the electron beam 1 to analyze the components of the object to be inspected 10. To minimize an influence of the characteristic X-ray detector 133 on the scanning electron microscope 120, an angle of the characteristic X-ray detector 133 may be controlled or the characteristic X-ray detector 133 may be carried in the scanning electron microscope chamber 100. For this, an angle controller 134 may be installed to the characteristic X-ray detector 133 or a characteristic X-ray detector carry-out door 111 may be installed to the scanning electron microscope chamber 100.

As shown in FIG. 2, a membrane 140 is installed on a lower portion 145 of the scanning electron microscope chamber 100 to seal an opening 155 constructed in the lower portion 145. The membrane 140 may be formed of a non-conductive material including carbon (C), nitrogen (N), oxygen (O), or silicon (Si) and a material having transmittance and low absorption such that the electron beam 1, the secondary electrons, the back-scattering electrons, and the characteristic X-ray are not absorbed by the membrane 140 and are transmitted through the membrane 140. In the membrane 140 made of carbon (C) and having excellent transmittance, the thickness may be in a range of 10 nm to 3 μm, and in this case, the transmittance of the membrane 140 is in a range of 90% to 100%. When the thickness of the membrane 140 is less than 10 nm, the membrane 140 is so thin that the membrane 140 may be easily damaged by a physical impact; when the thickness of the membrane 140 is more than 3 μm, the transmittance is less than 90% such that the electron beam 1 may be partially absorbed by the membrane 140 and thereby correct inspection may not be performed.

This membrane 140 maintains the vacuum condition of the scanning electron microscope chamber 100, and the electron beam 1 scanned in the scanning electron microscope 120 is simultaneously passed through the membrane 140 and may be irradiated onto the object to be inspected 10. Also, detecting signals of the secondary electrons, the back-scattering electrons, and the characteristic X-ray generated in the object to be inspected 10 are sent back to the interior of the scanning electron microscope chamber 100 such that they are transmitted to the secondary electron detector 131, the back-scattering electron detector 132, and the characteristic X-ray detector 133. Therefore, the membrane 140 maintains the atmospheric conditions between a space d between the scanning electron microscope chamber 100 and the object to be inspected 10. Accordingly, a contemporary vacuum scanning electron microscope 120 is limited to the size of the vacuum chamber 110 such that inspection of an object to be inspected 10 of a larger size such as a flat panel display device is difficult; according to the present invention, however, the atmospheric conditions are maintained between the scanning electron microscope chamber 100 and the object to be inspected 10 such that the inspection of the object to be inspected 10 of a larger size becomes possible in the atmospheric conditions.

Therefore, the shape, the component, the structure, etc., of the object to be inspected 10 of a larger size may be observed and analyzed.

Accordingly, the object to be inspected 10 with a larger size may be inspected for the analysis without damage to the object to be inspected 10 of a larger size such that the inspection cost may be reduced and the yield of manufacturing of the object to be inspected 10 may be improved.

Also, the object to be inspected 10 is positioned in the atmospheric conditions such that image distortion of the object to be inspected 10 caused by the charging effect generated in the vacuum chamber 110 is prevented and the object to be inspected 10 is not contaminated by carbon, thereby realizing the correct inspection.

As shown in FIG. 2, an optical microscope 400 is attached to the scanning electron microscope chamber 100, and irradiates light to the object to be inspected 10 to inspect the existence of a particle 2 attached to the surface of the object to be inspected 10. As described, the optical microscope 400 may be attached to the scanning electron microscope chamber 100 such that the optical microscope 400 may be simultaneously moved with the scanning electron microscope chamber 100 by the transverse guide 300.

A possible magnification of the optical microscope 400 is about 100 times at a maximum, and a possible magnification in the scanning electron microscope chamber 100 is about a million times such that the resolution of the scanning electron microscope chamber 100 is possible to be several nanometers. Accordingly, a first optical inspection of the object to be inspected 10 may be performed through the optical microscope 400, and a second detailed inspection of the object to be inspected 10 may be performed through the scanning electron microscope chamber 100 to obtain the information for the shape, the size, and the component of the particle 2.

As described, the inspection system using the scanning electron microscope according to an exemplary embodiment of the present invention includes the scanning electron microscope chamber 100 and the optical microscope 400 connected thereto such that the optical image of the particle 2 generated from the object to be inspected 10, the 3-D information of the object to be inspected 10, and the component analysis may be performed simultaneously.

As shown in FIG. 1, the stage 200 may be moved in X-axis, Y-axis, and Z-axis directions to inspect the entire region of the object to be inspected 10, and the transverse guide 300 may also independently move the scanning electron microscope chamber 100 in the X-axis, Y-axis, and Z-axis directions to enable the performance of an inspection of the entire region of the object to be inspected 10. More specifically, the transverse guide 300 may have one or more guide rails 1200. The scanning electron microscope chamber 100 may move back and forth along the axial direction of the guide rails 1200 under the control of the transverse guide 300. The stage 200 is installed with a lift pin 210 to receive the object to be inspected 10 from a transferring robot.

The scanning electron microscope chamber 100 and the optical microscope 400 attached thereto are connected to the transverse guide 300 such that the scanning electron microscope 120 and the optical microscope 400 may be simultaneously moved to a predetermined position over the object to be inspected 10 such that it is not limited to the size of the object to be inspected 10.

The stage 200 is installed with a flatness device 500 controlling flatness of the stage 200. A plurality of flatness devices 500 may be installed to the stage 200. The flatness device 500 measures the flatness of the stage 200 and controls the flatness such that a physical collision between the scanning electron microscope chamber 100 and the object to be inspected 10 is prevented.

The scanning electron microscope chamber 100 is attached with an interval control device 600, and the interval control device 600 measures the distance d between the scanning electron microscope chamber 100 and the object to be inspected 10 in real-time by using a laser sensor, and feeds a signal back to the transverse guide 300 to control the position of the scanning electron microscope chamber 100, and thereby the physical collision between the scanning electron microscope chamber 100 and the object to be inspected 10 is prevented.

The distance d between the lower portion 145 of the scanning electron microscope chamber 100 and the object to be inspected 10 may be close to a millimeter degree; the inspection system using the scanning electron microscope according to an exemplary embodiment of the present invention may reduce the distance d between the membrane 140 of the scanning electron microscope chamber 100 and the object to be inspected 10 down to the micrometer degree by using the flatness device 500 and the interval control device 600 such that analysis ability of the object to be inspected 10 may be improved.

As described, the transverse guide 300 is installed together with the scanning electron microscope chamber 100, the optical microscope 400, and the interval control device 600 such that the scanning electron microscope chamber 100, the optical microscope 400, and the interval control device 600 may be integrally moved by the transverse guide 300. Accordingly, the scanning electron microscope chamber 100, the optical microscope 400, and the interval control device 600 are simultaneously moved to all inspection positions of the object to be inspected 10 by using the transverse guide 300 without the limitation of the size of the object to be inspected 10, thereby performing the inspection process.

An electron control device 700 is installed on the transverse guide 300 to control the electronic devices disposed inside the scanning electron microscope chamber 100.

A supporting plate 800 is installed to support the stage 200 and the transverse guide 300, and a membrane particle inspection and removing device 900 is installed on the supporting plate 800. The membrane particle inspection and removing device 900 performs the inspection and removal of the particle attached to the surface of the membrane 140 before the inspection of the object to be inspected 10 using the scanning electron microscope chamber 100. Accordingly, an incomplete inspection of the object to be inspected 10 caused by the existence of particles attached to the surface of the membrane 140 may be prevented.

A vibration control device 1000 is installed under the supporting plate 800. The vibration control device 1000 measures and controls an external vibration, for example, the external vibration from a platform 2000 (as shown in FIG. 5) on which the inspection system is mounted; therefore, an influence by the external vibration on the scanning electron microscope chamber 100 may be prevented by the vibration control device 1000. In the atmospheric conditions, the microscope chamber 100 is influenced by the external vibration, however in an exemplary embodiment of the present invention, the influence of the external vibration on the scanning electron microscope chamber 100 may be minimized in the atmospheric conditions by installing the vibration control device 1000.

A cover frame 1100 is installed to entirely enclose the scanning electron microscope chamber 100, the stage 200, and the transverse guide 300. The cover frame 1100 is formed of a blocking material such as aluminum (Al) or permalloy such that external magnetism and noise generated by a surrounding device or a surrounding wire are prevented from being transmitted to the scanning electron microscope chamber 100. Therefore, the external magnetism and the external noise do not affect the scanning electron microscope chamber 100. The cover frame 1100 may be installed with a cover door 1110 for passing the object to be inspected 10 through and allow the object to be inspected 10 to be loaded to and unloaded from the stage 200. As described, during the inspection process for the object to be inspected 10, the cover door 1110 is closed such that the scanning electron microscope chamber 100 is completely shielded from the external magnetism and noise.

Also, a magnetic sensor 1120 is installed inside the cover frame 1100 to detect the magnetism on the scanning electron microscope 120. The detected magnitude of the magnetism by the magnetic sensor 1120 may be used as a feedback control signal to minimize the influence of the magnetism on the scanning electron microscope 120. Accordingly, the analysis ability for the object to be inspected 10 of the scanning electron microscope chamber 100 may be improved.

Figure 6A:
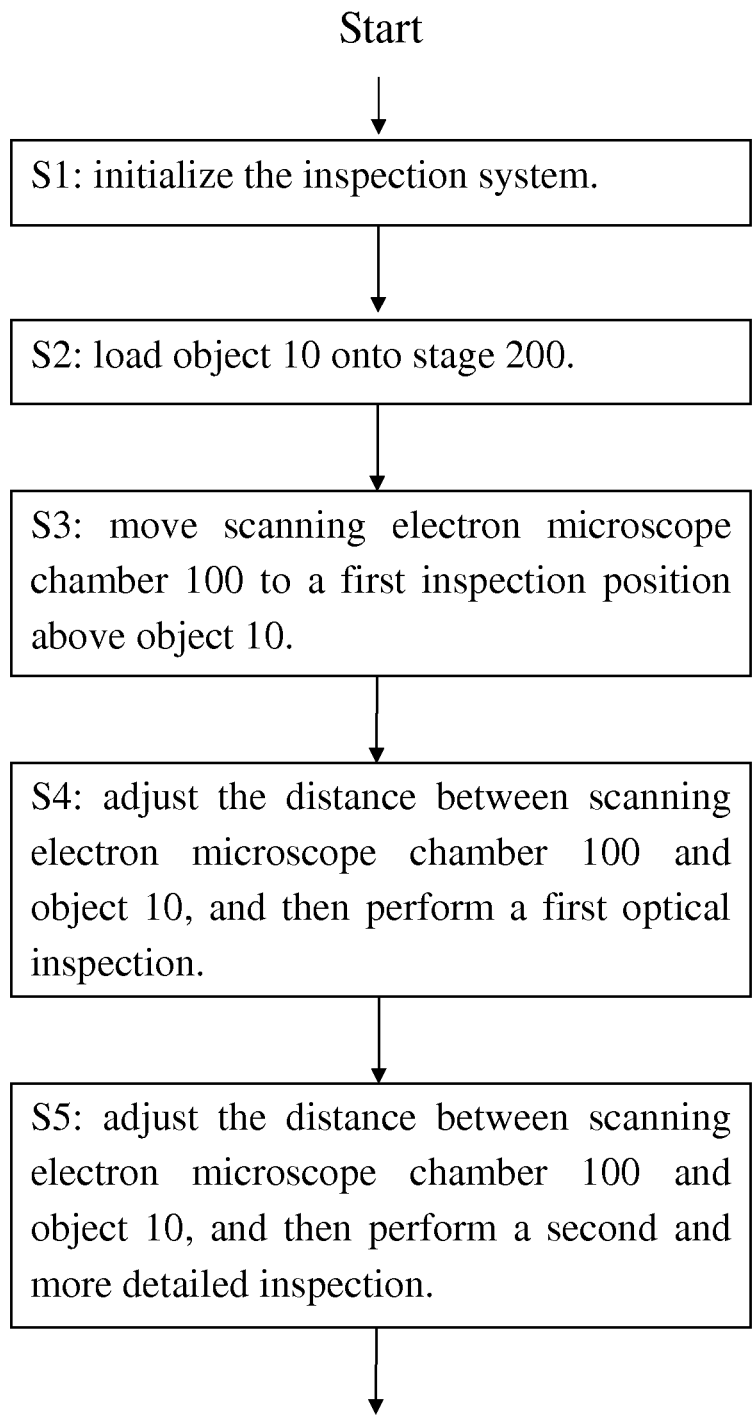
FIGS. 6A through 6C show an operational flow chart of an inspection system according to the practice of the present invention.
Figure 6B:
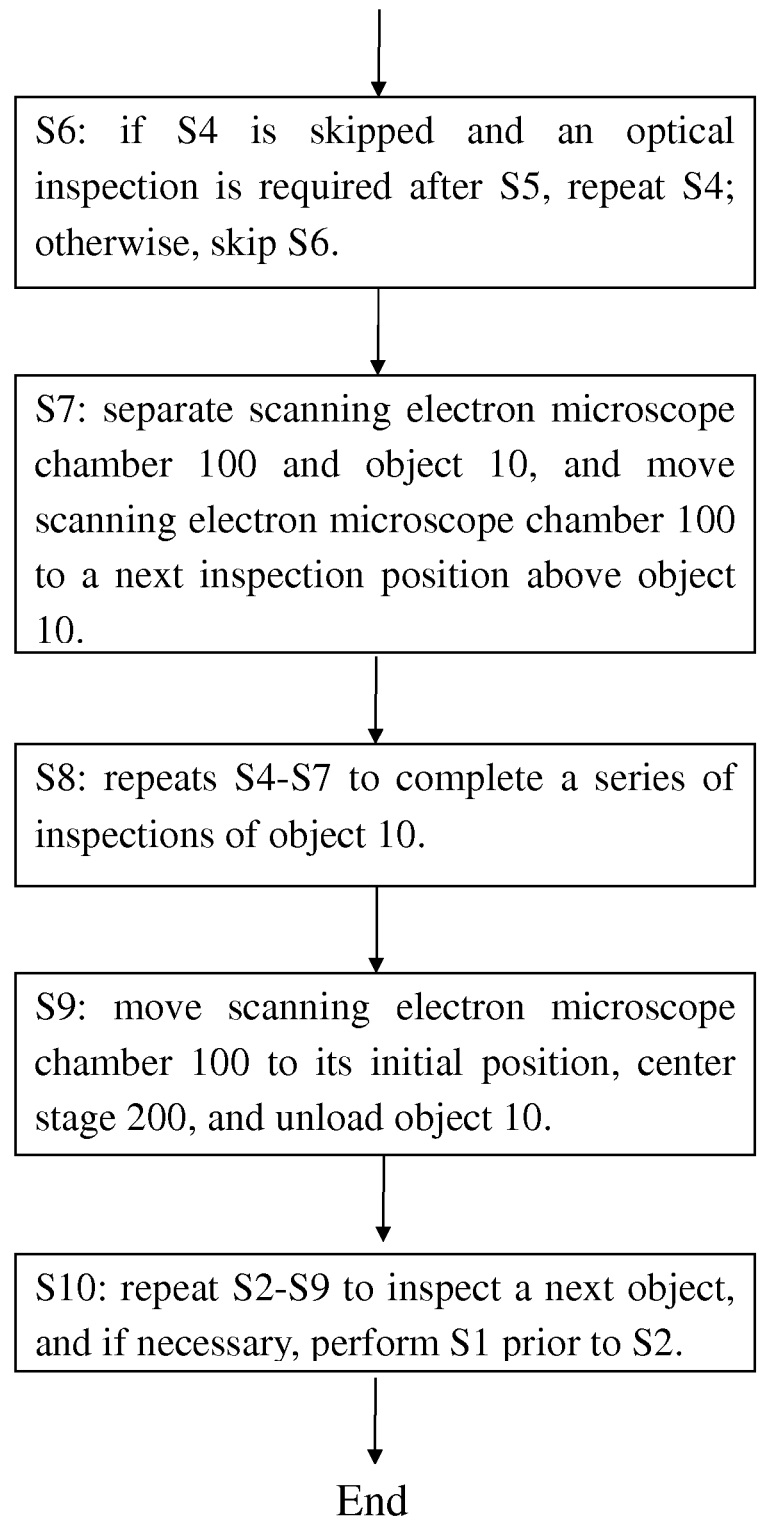
Figure 6C:
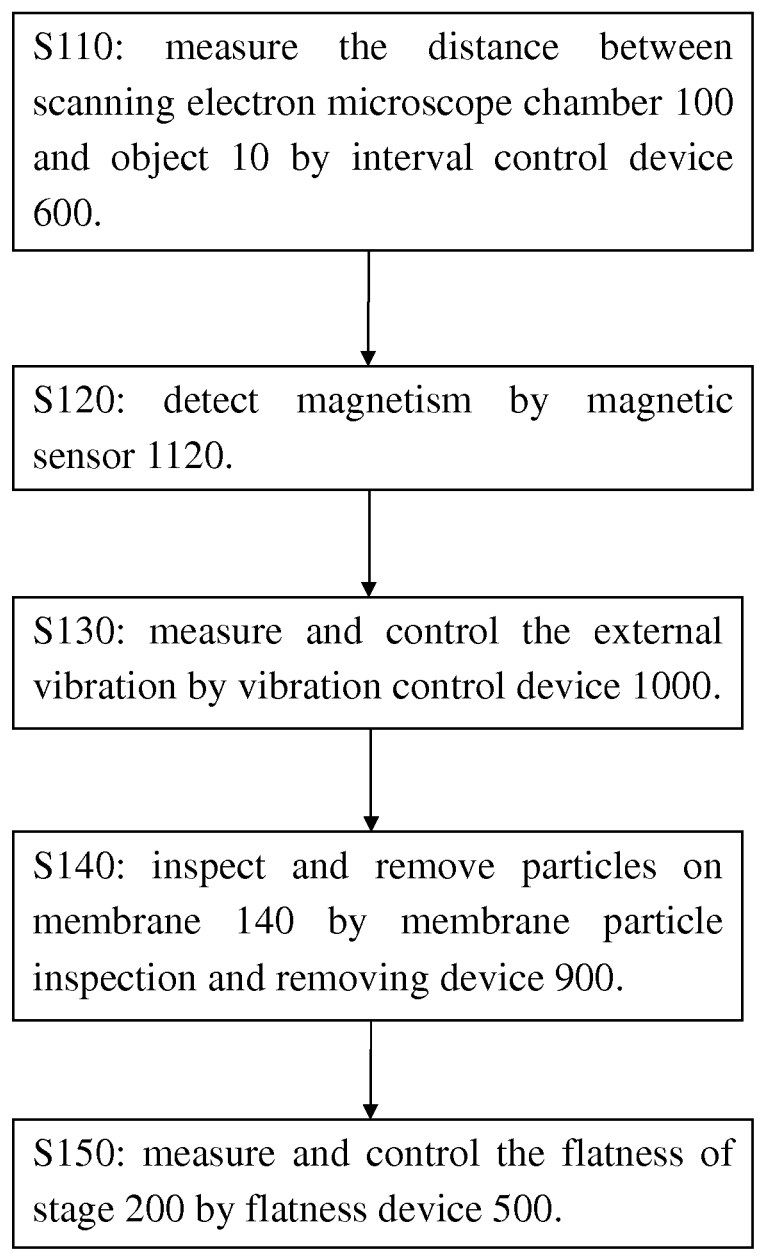

As described, according to the characteristics of the scanning electron microscope 120 that is sensitive to external noise such as external vibration, magnetism, and noise, the flatness device 500 and the variation control device 1000 are installed to the inspection system in the atmospheric conditions to inspect the object to be inspected 10 such that the influence of the external noise on the inspection system may be minimized FIGS. 6A through 6C show an operational flow chart of an inspection system according to the practice of the present invention. The operation of the inspection system may not be limited to FIGS. 6A through 6C.

The exemplary operation of the inspection system shown in FIGS. 6A through 6C may allow the inspection system to consecutively inspect a plurality of spots on an object. The exemplary operation of the inspection system may also allow the inspection system to continuously inspect a serial stream of a plurality of geometrically similar objects.

As shown in FIG. 6A through 6C, the operation of the inspection system may include 10 sequential steps, steps S1 through S10, and 5 discrete steps, steps S110 through S150. A discrete step may be performed in parallel with at least one of the sequential steps. On the other hand, a discrete step may be performed simultaneously while another discrete step is being conducted. Alternatively, a discrete step may be performed before or after one of the sequential steps. Detailed operation of one process for the practice of the inspection system is described as follows.

In step S1, the inspection system is initialized. The initialization may include moving scanning electron microscope chamber 100 to an initial position according to an initial position preprogrammed in transverse guide 300. The initialization may also include centering stage 200 to an initial position. The initialization may further include checking whether an object has been left on stage 200. If an object is found on stage 200, the object will be unloaded by a transfer robot or by an operator. Once step Si completes, scanning electron microscope chamber 100 and stage 200 are spaced apart from each other to allow an object to be inspected to be loaded onto stage 200.

In step S2, the inspection system may first check the status of the cover door 1110 of the cover frame 1100. If the cover door 1110 is closed, the inspection system will open the cover door 1110. After that, the transfer robot or the operator loads an object 10 that will be inspected by the inspection system onto stage 200. If the cover door 1110 is already open, the transfer robot may directly load an object 10 onto stage 200. Once object 10 is loaded, the inspection system will close the cover door 1110.

In step S3, transverse guide 300 moves scanning electron microscope chamber 100 to a position above object 10. Alternatively, object 10 may be moved by stage 200 to a position below scanning electron microscope chamber 100. Optionally, scanning electron microscope chamber 100 and object 10 may be simultaneously moved, each driven by transverse guide 300 and stage 200, respectively. Once step S3 completes, scanning electron microscope chamber 100 is located at a first inspection position in accordance with object 10 from which a series of inspections of object 10 start. The operator may preprogram the first inspection position into transverse guide 300 and/or stage 200 prior to inspection. On the other hand, the operator may manually control transverse guide 300 and/or stage 200 to setup the first inspection position during step S3.

In step S4, if an optical inspection is required, transverse guide 300 may gradually lower or lift electron microscope chamber 100 toward, or away from, the planar surface of stage 200, so that scanning electron microscope chamber 100 and object 10 may have a first predetermined distance from each other from which optical microscope 400 may perform a first optical inspection. Alternatively, stage 200 may gradually lift or lower object 10 toward, or away from, the bottom surface of scanning electron microscope chamber 100, so that scanning electron microscope chamber 100 and object 10 may have the first predetermined distance from each other. Optionally, scanning electron microscope chamber 100 and object 10 may simultaneously be moved toward, or away from, each other, driven by transverse guide 300 and stage 200, respectively, so that scanning electron microscope chamber 100 and object 10 may have the first predetermined distance from each other. Once the first predetermined distance between scanning electron microscope chamber 100 and object 10 is achieved, optical microscope 400 will perform an optical inspection of object 10. If an optical inspection is not required, step S4 may be skipped.

In step S5, if an inspection through scanning electron microscope chamber 100 is required, after similar operations as described in step S4, scanning electron microscope chamber 100 and object 10 may have a second predetermined distance from each other from which scanning electron microscope chamber 100 may perform an inspection. Once the second predetermined distance between scanning electron microscope chamber 100 and object 10 is achieved, scanning electron microscope chamber 100 will perform a more detailed inspection of object 10. If an inspection through scanning electron microscope chamber 100 is not required, step S5 may be skipped. Accordingly, the second predetermined distance may be different from the first predetermined distance. On the other hand, second predetermined distance may be substantially equal to the first predetermined distance, if scanning electron microscope chamber 100 and optical microscope have been installed in certain positions. In this case, distance adjustment in step S5 may be not required and the first optical inspection and the second and more detailed inspection may be simultaneously carried out.

In step S6, if step S4 is skipped and an optical inspection is required according to the inspection results obtained in S5, similar operations as described in S4 may take place to perform an optical inspection. In this scenario, an optical inspection is preformed after an inspection through scanning electron microscope chamber 100.

In step S7, after the inspections at the first inspection position is completed, the inspection system will check whether the current distance between scanning electron microscope chamber 100 and object 10 is in a safe range for a direct lateral movement between scanning electron microscope chamber 100 and object 10. If the current distance is out of the safe range, transverse guide 300 will lift scanning electron microscope chamber 100, and/or stage 200 will lower object 10, until the distance is in the safe range. And then, transverse guide 300 repositions scanning electron microscope chamber 100, and/or stage 200 repositions object 10, until scanning electron microscope chamber 100 is repositioned to a new inspection position in accordance with object 10. The operator may preprogram the next inspection position into transverse guide 300 and/or stage 200 prior to inspection. On the other hand, the operator may manually control transverse guide 300 and/or stage 200 to setup the next inspection position during step S7. Detailed repositioning of scanning electron microscope chamber 100 and/or object 10 is similar to the operation as described in step S3.

In step S8, The inspection system repeats steps S4 through S7 to complete a series of inspections of object 10 currently borne by stage 200.

In step S9, transverse guide 300 moves scanning electron microscope chamber 100 to its initial position, stage 200 centers itself to its initial position, the inspection system opens the cover door 1110, and the transfer robot or the operator unloads the inspected object 10.

In step S10, the inspection system repeats steps S2 through S9 to initiate an inspection of another object from among a plurality of objects that await inspection. If necessary, the inspection system may perform step S1 prior to step S2.

Once the entire inspection of all of the objects is complete, and the process of inspection ends. The inspection system is in idle state waiting for new inspections.

In step S110, interval control device 600 measures the distance between scanning electron microscope chamber 100 and object 10. The measured distance is sent to transverse guide 300 to control the position of scanning electron microscope chamber 100, and thereby a physical collision between scanning electron microscope chamber 100 and object 10 may be prevented. Alternatively, the measured distance may be sent to stage 200 to control the position of object 10. Preferably, step S110 may be simultaneously carried out during or before each, or in response to any relative movement between scanning electron microscope chamber 100 and object 10. Alternatively, step S110 may be simultaneously carried out during or before an inspection of each of a plurality of objects. Optionally, step S110 may be performed when the inspection system is in operation.

In step S120, magnetic sensor 1120 is employed to detect the presence of magnetism. The detected magnitude of the magnetism may be used as a feedback control signal in order to compensate for and to thereby minimized the influence of the magnetism on the scanning electron microscope 120. Preferably, step S120 may be simultaneously carried out during an inspection or before an inspection.

In step S130, vibration control device 100 may measure and control external vibration in order to minimize the influence of the external noise on the inspection system. Preferably, step S130 may be simultaneously performed during an inspection or before an inspection.

In step S140, membrane particle inspection and removing device 900 may check whether the exterior surface of membrane 140 contains any particles. If particles are found on the membrane 140, membrane particle inspection and removing device 900 will remove the particles. Preferably, step S140 may be carried out prior to step S6. Alternatively, step S140 may be conducted in other steps, such as step S1.

In step S150, flatness device 500 may measure the flatness of stage 200 and further control the flatness of stage 200. Step S150 is preferably performed prior to loading object 10. Alternatively, Step S150 may be included in step S1.

Although as shown in FIG. 6A and 6B, steps Si through S10 are sequentially conducted according one embodiment of the present invention, the inspection system may have other operation sequences which are not illustrated in FIG. 6. For example, the operation order of steps S5 and S4 may be reversed, and in this case, step S7 may be skipped. For another example, if the first distance to perform an optical inspection is substantially equal to the second distance to perform a more detailed inspection through scanning electron microscope chamber 100, steps S4 and S5 or steps S5 and S6 may be simultaneously conducted, and step S7 or step S4 may be consequently skipped. According to other embodiments of the present invention, the inspection system may respond to abnormal signals detected by monitor devices, such as magnetic sensor 1120, interval control device 600, membrane particle inspection and removing device 900, and flatness device 500, interrupting the ongoing operation and sending an alert signal to the operator.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>
1: electron beam
2: particle
10: object to be inspected
100: scanning electron microscope chamber
111: characteristic X-ray detector carry-out door
120: scanning electron microscope
121: electron gun
122: electromagnetic lens
123: aperture
130: signal detector
131: secondary electron detector
132: back-scattering electron detector
133: characteristic X-ray detector
134: angle controller
140: membrane
145: lower portion of the scanning electron microscope chamber 100
155: opening
200: stage
210: lift pin
300: transverse guide
400: optical microscope
500: flatness device
600: interval control device
700: electron control device
800: supporting plate
900: membrane particle inspection and removing device
1000: vibration control device
1100: cover frame
1110: cover door
1120: magnetic sensor
1200: guide rail
2000: platform

What is claimed is:

1. An inspection system using a scanning electron microscope, the inspection system comprising:
a scanning electron microscope chamber disposed to inspect an object to be inspected by using an electron beam and maintaining a vacuum condition within the scanning electron microscope chamber, the scanning electron microscope chamber including an electron transmissive membrane facing the object to be inspected;
a stage positioned spaced-apart from the scanning electron microscope chamber and supporting the object to be inspected;
a transverse guide disposed to transfer the scanning electron microscope chamber on the stage;
a space disposed between the electron transmissive membrane and the object and maintaining an atmosphere condition; and
a membrane particle inspection and removing device disposed to inspect a particle disposed on the electron transmissive membrane and removing the particle from the electron transmissive membrane.

2. The inspection system of claim 1, further comprising an optical microscope attached to the scanning electron microscope chamber and performing an inspection of the object by irradiating light onto the object.

3. The inspection system of claim 2, wherein a first optical inspection of the object to be inspected is performed through the optical microscope, and a second and more detailed inspection of the object to be inspected is performed through the scanning electron microscope chamber.

4. The inspection system of claim 2, wherein the scanning electron microscope chamber comprises:
a vacuum chamber;
the scanning electron microscope positioned inside the vacuum chamber and scanning the electron beam toward the object to be inspected; and
a signal detector positioned inside the vacuum chamber generating a detection signal in the object to be inspected.

5. The inspection system of claim 4, wherein the signal detector comprises:
a secondary electron detector sensitive to secondary electrons generated in the object to be inspected;
a back-scattering electron detector sensitive to back-scattering electrons generated in the object to be inspected; and
a characteristic X-ray detector sensitive to a characteristic X-ray generated in the object to be inspected.

6. The inspection system of claim 5,
wherein the electron transmissive membrane passes the electron beam scanned by the scanning electron microscope and permit transfer of the secondary electrons, the back-scattering electrons, and the characteristic X-ray generated in the object to be inspected to the interior of the scanning electron microscope chamber.

7. The inspection system of claim 2, further comprising a flatness device connected to the stage and controlling flatness of the stage.

8. The inspection system of claim 7, further comprising an interval control device connected to the scanning electron microscope chamber and controlling a distance between the scanning electron microscope chamber and the object to be inspected.

9. The inspection system of claim 2, wherein the object to be inspected includes a flat panel display device.

10. The inspection system of claim 1, wherein the membrane particle inspection and removing device is disposed to inspect the particle and remove the particle prior to the inspection of the object to be inspected by the scanning electron microscope chamber.

11. The inspection system of claim 10, further comprising a supporting plate supporting the stage and the transverse guide, the membrane particle inspection and removing device being installed on the supporting plate.

12. The inspection system of claim 11, further comprising a vibration control device installed below the supporting plate, the vibration control device measuring and eliminating an external vibration to prevent influence by the external vibration on the scanning electron microscope chamber.

13. The inspection system of claim 12, further comprising a cover frame enclosing the scanning electron microscope chamber, the stage, and the transverse guide, the cover frame discouraging magnetism and noise from affecting the scanning electron microscope chamber by attenuating the magnetism and noise.

14. The inspection system of claim 1, wherein a thickness of the electron transmissive membrane is in a range of 10 nm to 3 μm.

15. The inspection system of claim 14, wherein the electron transmissive membrane is an electrically non-conductive material.

* * * * *